US010690845B1

(12) United States Patent
Jacob et al.

(10) Patent No.: US 10,690,845 B1
(45) Date of Patent: Jun. 23, 2020

(54) THREE DIMENSIONAL OPTICAL INTERCONNECTS

(71) Applicant: GLOBALFOUNDRIES INC., Grand Cayman (KY)

(72) Inventors: Ajey Poovannummoottil Jacob, Watervliet, NY (US); Abu Thomas, Simi Valley, CA (US); Yusheng Bian, Ballston Lake, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/298,354

(22) Filed: Mar. 11, 2019

(51) Int. Cl.
*G02B 6/12* (2006.01)
*G02B 6/124* (2006.01)
*G02B 6/136* (2006.01)
*H01L 27/12* (2006.01)
*G02B 6/30* (2006.01)

(52) U.S. Cl.
CPC ......... *G02B 6/12002* (2013.01); *G02B 6/124* (2013.01); *G02B 6/136* (2013.01); *G02B 6/12004* (2013.01); *G02B 6/30* (2013.01); *G02B 2006/12061* (2013.01); *G02B 2006/12107* (2013.01); *H01L 27/1207* (2013.01)

(58) Field of Classification Search
None
See application file for complete search history.

(56) References Cited

U.S. PATENT DOCUMENTS 8,267,583 B2 *  9/2012  Yao ..................... G02B 6/13
                                                       384/31

OTHER PUBLICATIONS

Parekh, et al., "Electrical, Optical and Fluidic Through-Silicon Vias for Silicon Interposer Applications", IEEE 1992, 2011 Electronic Components and Technology Conference, 7 pages.
Louri et al., "3D optical interconnects for high speed interchip and interboard communications", IEEE, Oct. 1994, 11 pages.
Spuesens et al., "Compact Integration of Optical Sources and Detectors on SOI for Optical Interconnects Fabricated in a 200 mm CMOS Pilot Line", Journal of Lightwave Technology, vol. 30, No. 11, Jun. 1, 2012, 7 pages.
Chen et al., "Fully Embedded Board-Level Guided-Wave Optoelectronic Interconnects", Proceedings of the IEEE, vol. 88, No. 6, Jun. 2000, 14 pages.
Yu, "Potentials and challenges of using orbital angular momentum communications in optical interconnects", Optics Express 3075, published Feb. 2, 2015, vol. 23, No. 3, 13 pages.
Favi et al., "Techniques for Fully Integrated Intra-/Inter-chip Optical Communication", IEEE, Jul. 2, 2008, 3 pages.

* cited by examiner

*Primary Examiner* — Jerry Rahll
(74) *Attorney, Agent, or Firm* — Anthony Canale; Andrew M. Calderon; Roberts, Calderon, Safran & Cole, P.C.

(57) ABSTRACT

The present disclosure relates to semiconductor structures and, more particularly, to three dimensional (3D) optical interconnect structures and methods of manufacture. The structure includes: a first structure having a grating coupler and a first optical waveguide structure; and a second structure having a second optical waveguide structure in alignment with the first optical waveguide structure and which has a modal effective index that matches to the first optical waveguide structure.

20 Claims, 5 Drawing Sheets

THREE DIMENSIONAL OPTICAL INTERCONNECTS

FIELD OF THE INVENTION

The present disclosure relates to semiconductor structures and, more particularly, to three dimensional (3D) optical interconnect structures and methods of manufacture.

BACKGROUND

Three dimensional (3D) optical interconnects for high-speed computing offer many advantages over metal interconnects. For example, 3D optical interconnects provide high-speed transmission with low crosstalk independent of data rates. Currently, there are two major types of 3D optical interconnects: free-space optical interconnects and physical optical interconnects.

Free-space optical interconnects exploit free space (e.g., lenses and holograms in free space). Free-space optical interconnects, by virtue of their inherent parallelism, exhibit high data bandwidth, small size and power requirement, and relative freedom from mutual interference of signals. With these features, free-space optical interconnects show great promise in replacing metal interconnects to solve communication problems.

Physical optical interconnects, on the other hand, have a relatively low interconnection density, and lack of bending or looping flexibility. The physical optical interconnect can also suffer from crosstalk between adjacent optical waveguide structures, and can exhibit severe coupling losses.

SUMMARY

In an aspect of the disclosure, a structure comprises: a first structure comprising a grating coupler and a first optical waveguide structure; and a second structure comprising a second optical waveguide structure in alignment with the first optical waveguide structure and which has a modal effective index that matches to the first optical waveguide structure.

In an aspect of the disclosure, a structure comprises: a first structure composed of silicon on insulator technology and comprising a grating coupler, a plurality of semiconductor islands and a first optical waveguide structure; a second structure bonded to a dielectric material of the first structure, the second structure being composed of bulk semiconductor technology and comprising a second optical waveguide structure in alignment with the first optical waveguide structure and which has a modal effective index that matches the first optical waveguide structure; and a third structure bonded to a dielectric material of the second structure, the third structure being composed of the bulk semiconductor technology and comprising a third optical waveguide structure in a same plane as a coupler.

In an aspect of the disclosure, a method comprises: forming a first structure composed of silicon on insulator technology and comprising a grating coupler, a plurality of semiconductor islands and a first optical waveguide structure; forming a second structure composed of bulk semiconductor technology and comprising a second optical waveguide structure having a modal effective index that matches the first optical waveguide structure; forming a third structure composed of the bulk semiconductor technology and comprising a third optical waveguide structure in a same plane as a coupler; placing a wafer handler on the second structure and bonding the second structure to an oxide material of the first structure such that the first optical waveguide structure and the second optical waveguide structure are in alignment; removing the wafer handler from the second structure and placing a wafer handler on the third structure; and bonding the third structure to an oxide material of the second structure such that the third optical waveguide structure is above the second optical waveguide structure.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to three dimensional (3D) optical interconnect structures and methods of manufacture. More specifically, the present disclosure provides various 3D optical interconnect structures using phase matching techniques. For example, in embodiments, the 3D optical interconnect structures described herein can couple light from a first optical waveguide structure to another optical waveguide structure on an upper layer (3D layer) without the use of any detector schemes. Accordingly and advantageously, the 3D optical interconnect structures described herein do not require 3D optical via interconnects, amongst other advantages as described herein.

In embodiments, by implementing the 3D optical interconnect structures mode-selectivity can be achieved in vertical coupling using phase matching, with the center-wavelength and spectrum of coupling precisely controlled via the phase matching. Moreover, the amount of power transferred can be precisely controlled by controlling the ratio of the physical length of a coupler and the coherence length of the coupler. Furthermore, the power transfer can be bi-directional in the vertical plane which can be precisely controlled. Also, the coupling between an optical waveguide structure in one plane and semiconductor slab in another plane is insensitive to overlay.

The 3D optical interconnect structures of the present disclosure can be manufactured in a number of ways using a number of different tools. In general, though, the methodologies and tools are used to form structures with dimensions in the micrometer and nanometer scale. The methodologies, i.e., technologies, employed to manufacture the 3D optical interconnect structures of the present disclosure have been adopted from integrated circuit (IC) technology. For example, the structures are built on wafers and are realized in films of material patterned by photolithographic processes on the top of a wafer. In particular, the fabrication of the 3D optical interconnect structures uses three basic building blocks: (i) deposition of thin films of material on a substrate, (ii) applying a patterned mask on top of the films by photolithographic imaging, and (iii) etching the films selectively to the mask.

Figure 1:
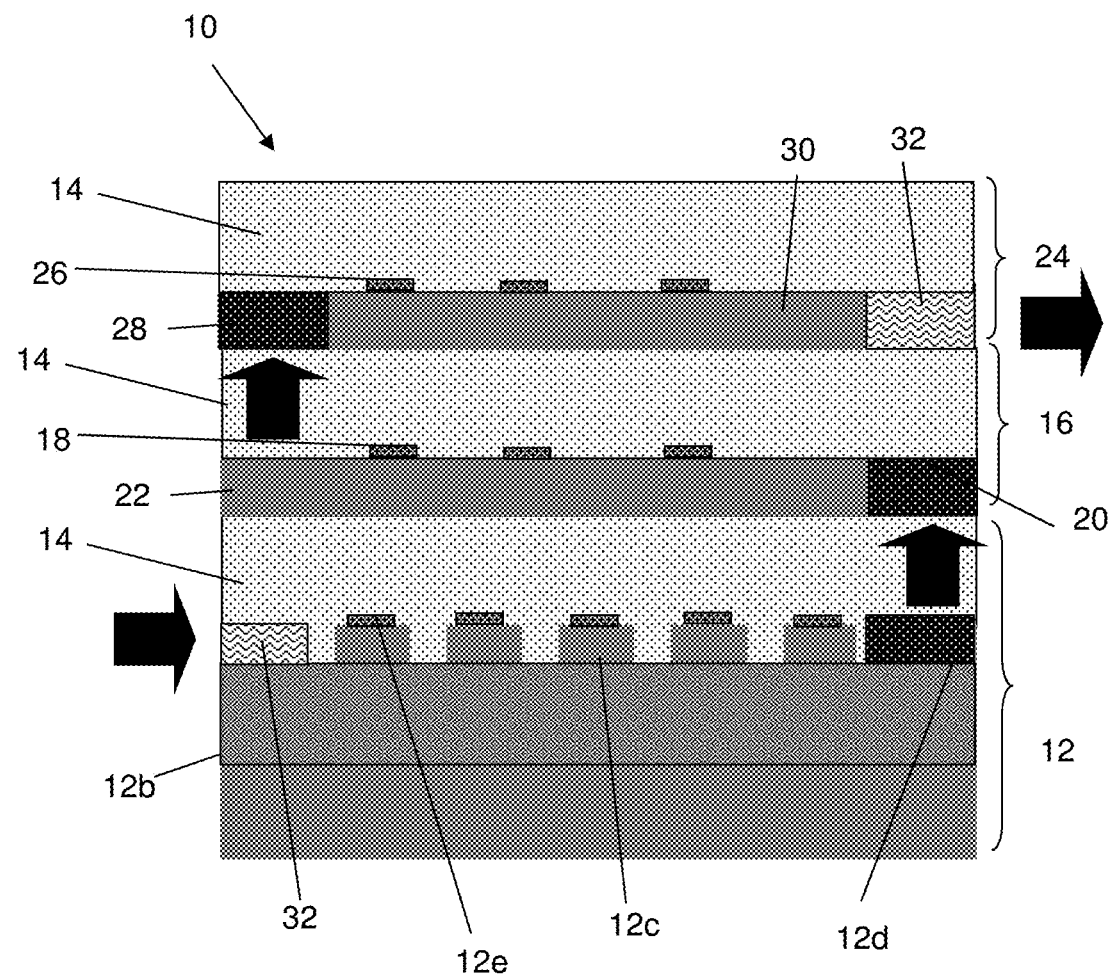
FIG. 1 shows a three dimensional (3D) optical interconnect structure in accordance with aspects of the present disclosure.

FIG. 1 shows a three dimensional (3D) optical interconnect structure in accordance with aspects of the present disclosure. In particular, the three dimensional (3D) optical interconnect structure 10 includes a plurality of layers (e.g., bonded structures) 12, 16 and 24, each with an optical waveguide structure for the facilitation of an optical transmission through each of the layers as described herein (and as represented by the arrows). The structures 12, 16 and 24 can each be fabricated separately and bonded to one another after the fabrication process as representatively shown in FIGS. 3A-3D. It should be understood by those of skill in the art that two or more bonded structures are contemplated herein, and that the use of three layers are provided only for illustrative purposes.

In embodiments, the layer (e.g., lower structure) 12 includes a semiconductor on insulator (SOI) wafer which is composed of an insulator layer (buried oxide layer) 12b bonded to a wafer 12a. Although the wafer 12a can be Si material, the present disclosure contemplates other semiconductor materials. The SOI wafer further includes a semiconductor material 12c bonded to the insulator layer 12b. In embodiments, the semiconductor material 12c is Si; however, the material 12c may be composed of any suitable material including, but not limited to, Si, SiGe, SiGeC, SiC, GaAs, InAs, InP, and other III/V or II/VI compound semiconductors. The SOI wafer can be fabricated using any conventional fabrication methods including, e.g., SiMOX or wafer bonding techniques (e.g., oxide bonding technique).

The semiconductor material 12c can be patterned (e.g., etched) into separate islands using conventional lithography and etching processes as is known in the art. For example, after device fabrication, a resist is formed over the semiconductor material 12c and exposed to energy (light) to form a pattern (opening). An etching process with a selective chemistry, e.g., reactive ion etching (RIE), will be used to form one or more of the islands of semiconductor material 12c. The resist can then be removed by a conventional ashing process or other known stripants.

Still referring to FIG. 1, an optical waveguide structure 12d is fabricated from the semiconductor material 12c. As should be understood by those of skill in the art, the optical waveguide structure 12d is a physical structure that guides electromagnetic waves in the optical spectrum. The optical waveguide structure 12d can be classified according to its geometry (e.g., planar), mode structure (single-mode, multimode), modal effective index distribution (step or gradient index) and material (glass, polymer, semiconductor, etc.). In embodiments, the optical waveguide structure 12d is an Si optical waveguide structure.

It should be understood by those of skill in the art that modal effective index is material index. The phase matching is caused by mode effective index. Modal effective index is the effective modal effective index of the material based on factors such as dimension and environment surrounding it.

FIG. 1 further shows a plurality of devices, represented by reference numeral 12e, fabricated on the semiconductor material 12c. In embodiments, the devices 12e can be different devices, e.g., photodetectors, ASIC, memory devices, flash devices, modulators, receivers, transistors, integrated circuits, or any combination thereof. The devices 12e can be fabricated using any known and appropriate fabrication techniques, e.g., deposition, lithography and etching processes, such that a further explanation is not required herein for a complete understanding of the present disclosure. As shown in FIG. 1, the devices 12e will be located so as to not block the input transmission (optical transmission) from entering the optical waveguide structure 12d.

An interlevel dielectric material (e.g., oxide) 14 is deposited over the patterned semiconductor material 12c, optical waveguide structure 12d and devices 12e. In embodiments, the interlevel dielectric material (e.g., oxide) 14 is deposited by a chemical vapor deposition (CVD) process, followed by a planarization process, e.g., chemical mechanical planarization (CMP). The interlevel dielectric material (e.g., oxide) 14 is transparent and allows the input transmission (optical transmission) to travel from a grating coupler 32 to the optical waveguide structure 12d. As shown in FIG. 1, the grating coupler 32 and the optical waveguide structure 12d are provided in a same plane with the islands of the SOI material 12c.

As further shown in FIG. 1, a second layer (e.g., structure) 16 is bonded to the interlevel dielectric material (e.g., oxide) 14 of the first structure 12. In embodiments, the second structure 16 comprises a plurality of devices 18 and an optical waveguide structure 20. The plurality of devices 18 are formed on a bulk substrate (e.g., Si) 22, which facilitates the optical transmission. The plurality of devices 18 can be any of the devices as noted above with respect to reference numeral 12e. The optical waveguide structure 20 is aligned with the optical waveguide structure 12e and can be composed of SiN, Si or metal material as examples; although other materials with a modal effective index that matches that of the optical waveguide structure 12d are also contemplated herein. In this way, the optical waveguide structures 12d, 20 will have a phase matching which facilitates the optical transmission between the optical waveguide structures 12d, 20 (through the interlevel dielectric material (e.g., oxide) 14). An interlevel dielectric material (e.g., oxide) 14 is deposited (and planarized) over the optical waveguide structure 20 and devices 18 as already described herein.

FIG. 1 further shows a third layer (e.g., upper structure) 24 bonded to the planarized oxide material 14 of the second structure 16. Similar to the second structure 16, the upper structure 24 includes a plurality of devices 26 and an optical waveguide structure 28. The plurality of devices 26 are formed on a bulk substrate (e.g., Si) 30, which can transmit the optical transmission received from the substrate 22. The plurality of devices 26 can be any of the devices as noted above with respect to reference numeral 12e.

The optical waveguide structure 28 can be composed of SiN, Si material or metal material as examples; although the optical waveguide structure 28 can be other materials which have a modal effective index that matches that of the optical waveguide structures 12d, 20 such that the optical waveguide structures 12d, 20, 28 will have a phase matching. In this way, the optical transmission can be transmitted from the optical waveguide structure 12d to the optical waveguide structures 20, 28. Similar to the first and second structures 12, 16, an interlevel dielectric material (e.g., oxide) 14 is deposited over the devices 26, the optical waveguide structure 28 and the substrate (e.g., Si) 30. In embodiments, the input and output of the optical transmission (as represented by arrows) can be through the respective grating couplers as represented by reference numeral 32. As shown in FIG. 3, the grating coupler 32 and the optical waveguide structure 28 are provided in a same plane.

It should now be understood in view of the above discussion that the structures 12, 16 and 24 are devoid of any optical via interconnects. That is, there are no optical via interconnects between any of the different optical waveguide structures 12b, 20, 28. Instead, by using a matching modal effective index of the optical waveguide structures it is now possible to transmit light through and between the optical waveguide structure 12b, 20 and 28 without the use of any optical via interconnects. That is, the transmission of the light can be achieved in vertical coupling using phase matching.

Figure 2:
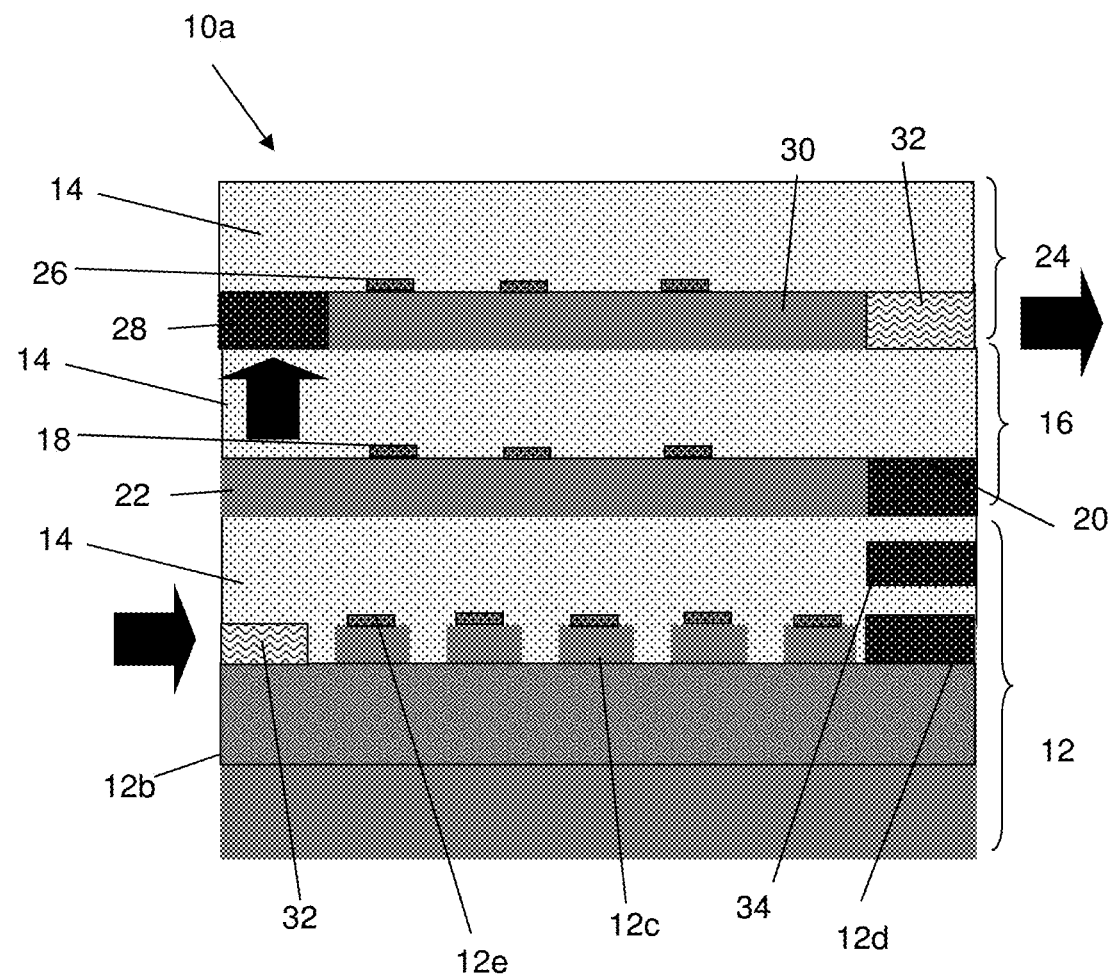
FIG. 2 shows a three dimensional (3D) optical interconnect structure in accordance with additional aspects of the present disclosure.

FIG. 2 shows a three dimensional (3D) optical interconnect structure in accordance with additional aspects of the present disclosure. In FIG. 2, the structure 10a includes an additional optical waveguide structure 34 embedded within the interlevel dielectric material 14 between the first structure 12 and the second structure 16, and more particularly, between the lower optical waveguide structure 12e and the upper optical waveguide structure 20. In embodiments, the additional optical waveguide structure 34 is aligned with the lower optical waveguide structure 12e and the upper optical waveguide structure 20 to allow transmission of the optical transmission between the lower optical waveguide structure 12e and the upper optical waveguide structure 20.

The additional optical waveguide structure 34 may be used when the interlevel dielectric material 14 between the two structures 12, 16 is too thick for the transmission of the optical transmission. For example, in embodiments, the additional optical waveguide structure 34 may be used when the interlevel dielectric material is in the range of, e.g., 10 nanometer to 10 microns; although other dimensions are contemplated herein. In alternative embodiments, the additional optical waveguide structure 34 may be used when the modal effective index of the interlevel dielectric material 14 warrants such need for the additional optical waveguide structure 34.

In illustrative embodiments, the distance between the optical waveguide structure can be extended to several and even tens of microns, which can be implemented by optimizing the waveguide width and length of the adiabatic transition region. Typically, the larger the distance (separation), the longer the transition region. With appropriate optimization, the efficiency could be as high as 99.9%, with any additional loss primarily coming from the propagation loss of the waveguide and the transition region.

In further embodiments, the optical waveguide structure 20 has a modal effective index that does not match the optical waveguide structure 12d while the optical waveguide structures 20 and 34 have matching modal effective indices. In such a situation, there will be optical transmission of light that passes from the first optical waveguide 12d structure to the optical waveguide structure 34 through the optical waveguide 20 structure without any optical interference.

Figure 3A:
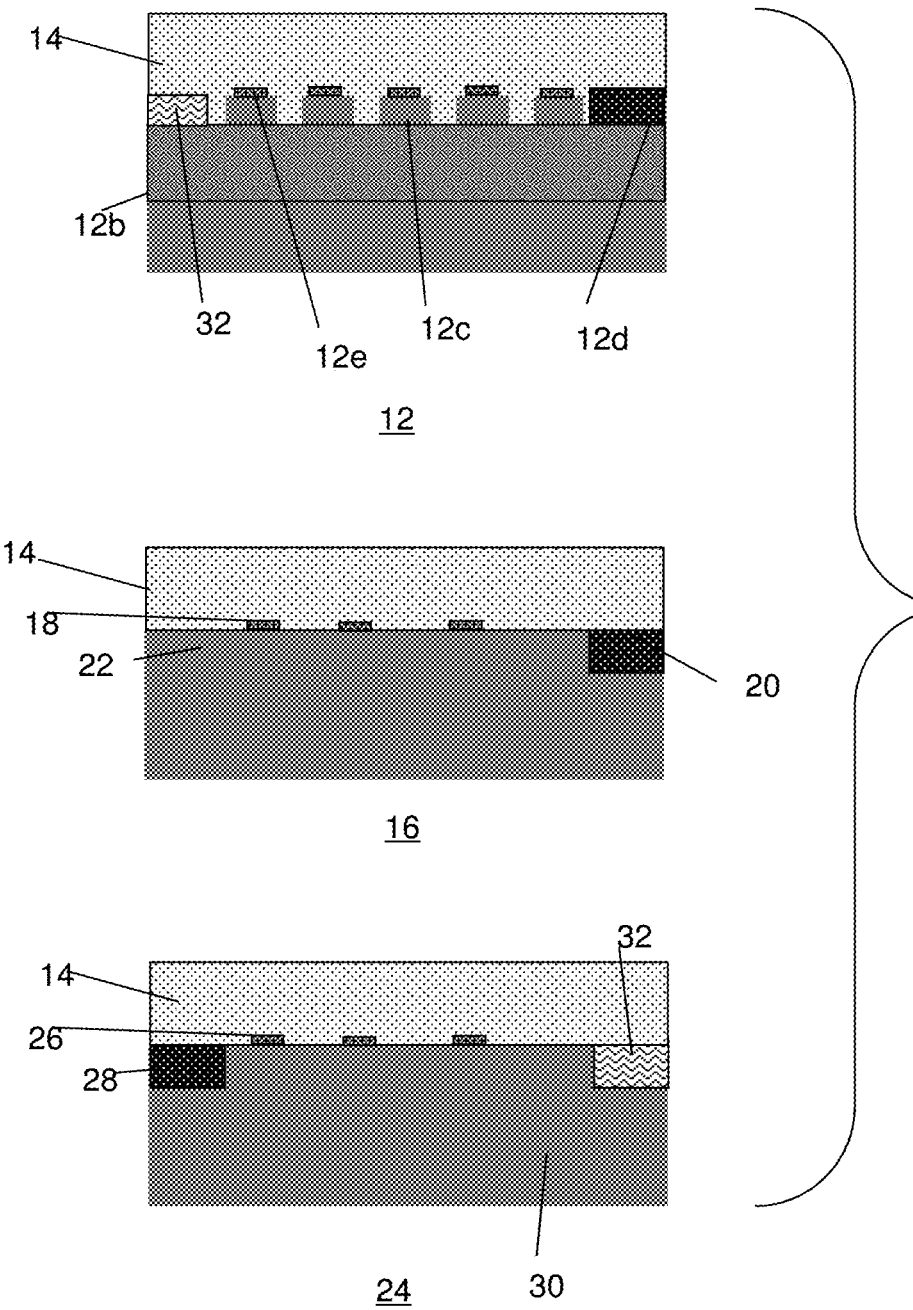
FIGS. 3A-3D show process steps for fabricating the three dimensional (3D) optical interconnect structures in accordance with aspects of the present disclosure.
Figure 3B:
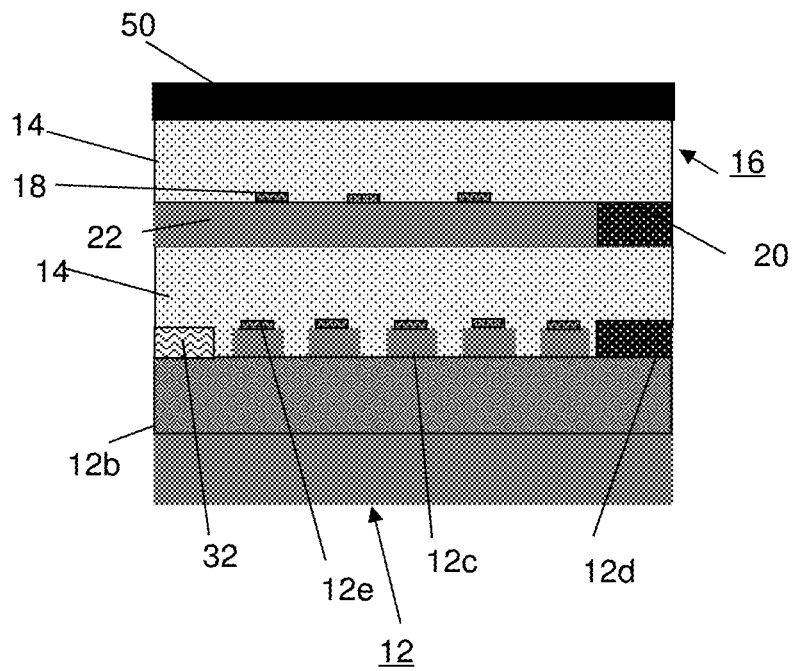

FIGS. 3A-3D show process steps for fabricating the three dimensional (3D) optical interconnect structure in accordance with aspects of the present disclosure. FIG. 3A representatively shows first structure 12, second structure 16 & third structure 24 as described above. The fabrication process of each of the structures 12, 16, 24 includes the device formation, in addition to the formation of the optical waveguide structures as already described herein. FIG. 3B shows a stacked structure wherein structure 16 has been further processed and bonded to structure 12. An illustrative example of obtaining this stacked structure is as follows: a handle wafer 50 is first bonded to the interlevel dielectric material 14 of the second structure 16, followed by backside etching and grinding to thin down wafer 22. The thinned second structure 16 is then bonded to the first structure 12 at the wafer 22 side using an oxide bonding technique.

Figure 3C:
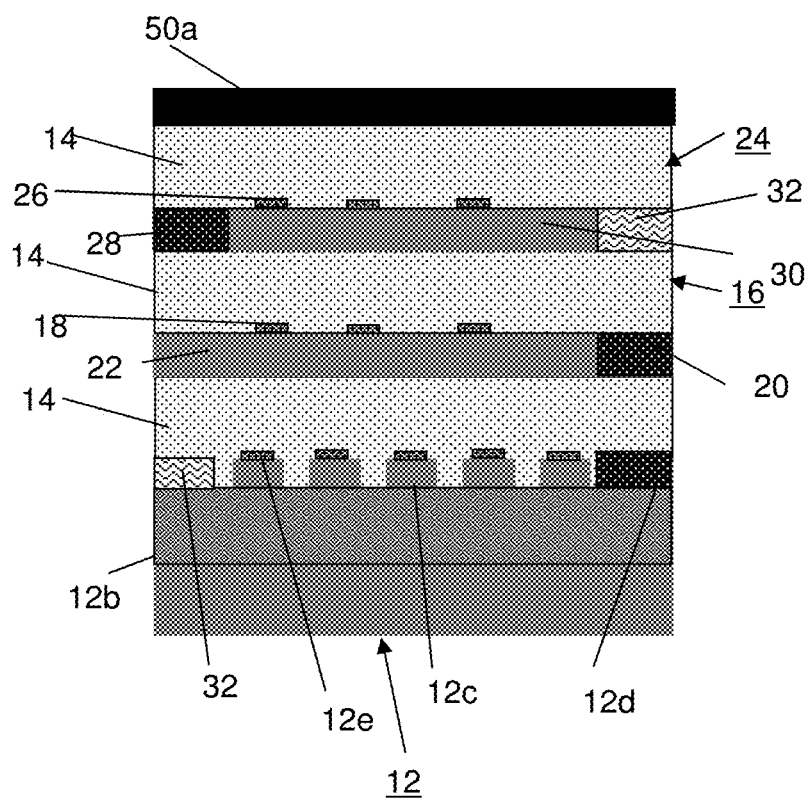
Figure 3D:
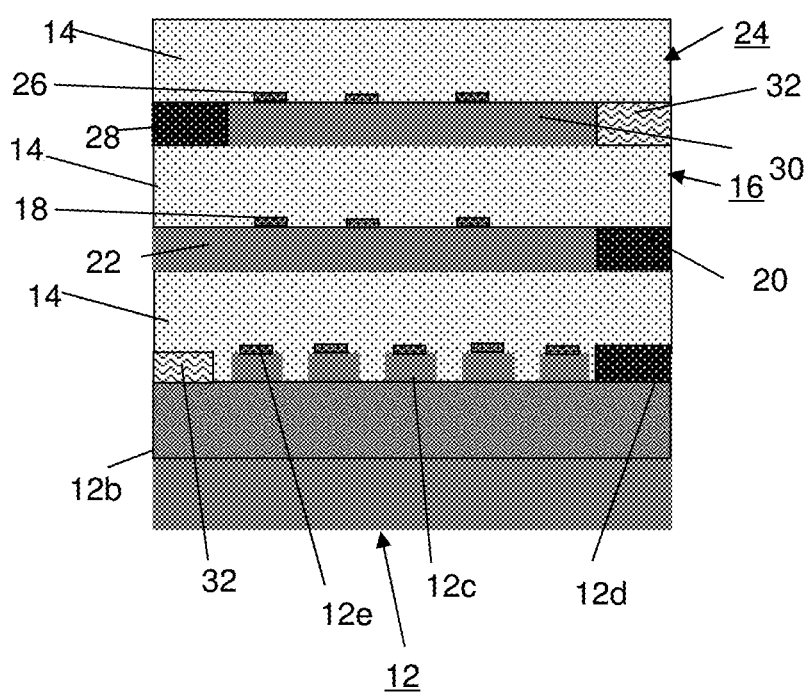

FIG. 3C shows the stacked structure of FIG. 3A with the handle wafer 50 removed and further stacked with a processed third structure 24. Another handle wafer 50a is bonded to the interlevel dielectric material 14 of the third structure 24 using an oxide bonding technique. In embodiments, the wafer 30 of the third structure 24 is thinned by a backside etching and grinding process as described above. Using the handle wafer 50a, the thinned third structure 24 is then bonded to the second structure 16 using an oxide bonding technique. The handle wafer 50a can then be removed, as shown in FIG. 3D.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a first structure comprising a grating coupler and a first optical waveguide structure; and
   a second structure comprising a second optical waveguide structure in alignment with the first optical waveguide structure and which has a modal effective index that matches to the first optical waveguide structure.

2. The structure of claim 1, wherein the first structure is silicon on insulator technology and the second structure is bulk substrate technology.

3. The structure of claim 1, wherein the first optical waveguide structure is composed of Si material or SiN material, and the second optical waveguide structure is composed of SiN material, Si material or metal.

4. The structure of claim 1, wherein the first optical waveguide structure and the second optical waveguide structure are separated by dielectric material of the first structure.

5. The structure of claim 4, further comprising a third optical waveguide structure embedded within the dielectric material and aligned with the first optical waveguide structure and the second optical waveguide structure.

6. The structure of claim 5, wherein the third optical waveguide structure has a modal effective index that matches the first optical waveguide structure and the second optical waveguide structure such that optical transmission of light passes through the first optical waveguide structure to and through the third optical waveguide structure and to and through the second optical waveguide structure without a an optical via interconnect.

7. The structure of claim 5, wherein the second optical waveguide structure has a modal effective index that does not match the first optical waveguide structure and the third optical waveguide structure such that optical transmission of light passes from the first optical waveguide structure to the third optical waveguide structure through the second optical waveguide structure without any optical interference.

8. The structure of claim 5, wherein the third optical waveguide structure has a modal effective index that matches the first optical waveguide structure and the second optical waveguide such that optical transmission of light passes from the first optical waveguide structure to the third optical waveguide structure through the second optical waveguide structure with low loss optical interference.

9. The structure of claim 1, further comprising a third structure comprising a grating coupler and an upper optical waveguide structure, wherein the first structure is silicon on insulator technology, the second structure is bulk substrate technology, the third structure is the bulk substrate technology, and the grating coupler and the upper optical waveguide structure are in a same plane.

10. The structure of claim 9, wherein the first optical waveguide structure, the second optical waveguide structure and the upper optical waveguide structure each have a matching modal effective index such that optical transmission of light passes through the first optical waveguide structure to and through the second optical waveguide structure and to and through the upper optical waveguide structure to the grating coupler of the third structure without an optical via interconnect.

11. A structure comprising:
a first structure composed of silicon on insulator technology and comprising a grating coupler, a plurality of semiconductor islands and a first optical waveguide structure;
a second structure bonded to a dielectric material of the first structure, the second structure being composed of bulk semiconductor technology and comprising a second optical waveguide structure in alignment with the first optical waveguide structure and which has a modal effective index that matches the first optical waveguide structure; and
a third structure bonded to a dielectric material of the second structure, the third structure being composed of the bulk semiconductor technology and comprising a third optical waveguide structure in a same plane as a coupler.

12. The structure of claim 11, wherein the first optical waveguide structure is composed of Si material or SiN material, and the second optical waveguide structure and the third optical waveguide structure are composed of SiN material, Si material or metal.

13. The structure of claim 11, wherein the first optical waveguide structure, the second optical waveguide structure and the third optical waveguide structure have a matching modal effective index.

14. The structure of claim 13, further comprising an intermediate optical waveguide structure embedded with the dielectric material of the first structure and in alignment with the first optical waveguide structure and the second optical waveguide structure.

15. The structure of claim 14, wherein the intermediate optical waveguide structure has a modal effective index that matches the first optical waveguide structure and the second optical waveguide structure such that optical transmission of light passes through the first optical waveguide structure to and through the intermediate optical waveguide structure and to and through the second optical waveguide structure without an optical via interconnect.

16. The structure of claim 11, wherein the grating coupler, the plurality of semiconductor islands and the first optical waveguide structure of the first structure are in a same plane to allow an optical transmission from the grating coupler to the first optical waveguide structure.

17. The structure of claim 11, wherein the first optical waveguide structure transmits an optical transmission through the dielectric material of the first structure to the second optical waveguide structure without an optical via interconnect.

18. The structure of claim 17, wherein:
the second optical waveguide structure transmits the optical transmission through the bulk substrate of the second structure to the third optical waveguide structure without an optical via interconnect; and
the third optical waveguide structure transmits the optical transmission through the bulk substrate of the third structure to the grating coupler of the third structure.

19. A method comprising:
forming a first structure composed of silicon on insulator technology and comprising a grating coupler, a plurality of semiconductor islands and a first optical waveguide structure;
forming a second structure composed of bulk semiconductor technology and comprising a second optical waveguide structure having a modal effective index that matches the first optical waveguide structure;
forming a third structure composed of the bulk semiconductor technology and comprising a third optical waveguide structure in a same plane as a coupler;
placing a wafer handler on the second structure and bonding the second structure to an oxide material of the first structure such that the first optical waveguide structure and the second optical waveguide structure are in alignment;
removing the wafer handler from the second structure and placing a wafer handler on the third structure;
bonding the third structure to an oxide material of the second structure such that the third optical waveguide structure is above the second optical waveguide structure; and
forming an intermediate optical waveguide structure embedded with the dielectric material of the first structure and in alignment with the first optical waveguide structure and the second optical waveguide structure.

20. The method of claim 19, wherein:
prior to the bonding of the second structure to the first structure, a backside etching and grinding is performed to thin a wafer of the bulk semiconductor technology of the second structure; and
prior to the bonding of the third structure to the second structure, a backside etching and grinding is performed to thin a wafer of the bulk semiconductor technology of the third structure.

* * * * *